United States Patent [19]
Weber et al.

[11] Patent Number: 5,398,519
[45] Date of Patent: Mar. 21, 1995

[54] THERMAL CONTROL SYSTEM

[75] Inventors: Richard Weber, Prosper; Donald C. Price, Dallas, both of Tex.

[73] Assignee: Texas Instruments Incorporated, Dallas, Tex.

[21] Appl. No.: 912,928

[22] Filed: Jul. 13, 1992

[51] Int. Cl.⁶ ............................................. F25D 7/00
[52] U.S. Cl. ........................................ 62/201; 62/99; 62/217; 62/259.2; 165/911; 165/41
[58] Field of Search ............... 62/217, 99, 201, 259.2; 165/104.33, 911, 41

[56] References Cited

U.S. PATENT DOCUMENTS

| | | | |
|---|---|---|---|
| 2,925,722 | 2/1960 | Blackburn et al. | 62/217 |
| 3,106,070 | 10/1963 | Harper et al. | 62/217 |
| 3,242,688 | 3/1966 | Miller | 62/217 |
| 3,245,248 | 4/1966 | Ritter | 62/217 |
| 3,538,718 | 11/1970 | Karbosky | 62/217 |
| 4,459,818 | 7/1984 | Kaya et al. | 62/201 |

FOREIGN PATENT DOCUMENTS

| | | |
|---|---|---|
| 0480750 | 4/1992 | European Pat. Off. . |
| 176363 | 7/1990 | Japan ............... 62/201 |

*Primary Examiner*—Albert W. Davis, Jr.
*Attorney, Agent, or Firm*—René E. Grossman; Richard L. Donaldson

[57] ABSTRACT

A thermal control system in which a boiling liquid refrigerant is vaporized by heat addition from the system electronics. The pressure on the boiling liquid refrigerant and the vaporized refrigerant thereover is maintained constant so that the temperature of vaporization is maintained constant. For this reason, the boiling liquid refrigerant rapidly vaporizes and concomitantly removes from the system the very large amount of heat required for the refrigerant to pass from the liquid to the gaseous phase. The heat transfer rates under these conditions are extremely high. In addition to heat addition to the liquid before vaporization, the mass of liquid vaporized absorbs heat during vaporization of the liquid. The transition from liquid to vapor occurs at a constant temperature which is controlled by controlling the pressure at which the vaporization takes place. The vaporization pressure is controlled by a back-pressure regulator and the liquid is supplied to the evaporator from a pressurized reservoir and is controlled by a pressure/flow regulator. The pressure in the pressurized reservoir is maintained at a higher level than the desired pressure within the evaporator so that fluid flow will always flow from reservoir to evaporator. The specific pressure within the evaporator is controlled within very narrow limits by the back-pressure regulator.

15 Claims, 3 Drawing Sheets

THERMAL CONTROL SYSTEM

BACKGROUND OF THE INVENTION

1. Field of the Invention

This invention relates to a thermal control system capable of rejecting large amounts of heat and maintaining heat generating devices at a substantially constant and uniform temperature without the use of a closed-loop environmental control system (ECS) wherein the use of an expendable fluid to provide the refrigeration effect results in a heat rejection capacity very much in excess of any form of active environmental control unit (ECU) that could be packaged within the constraints of size and available prime power.

2. Brief Description of the Prior Art

Airborne electronic systems normally have thermal control systems which are supplied with a gaseous or liquid coolant from an airborne ECS which is basically a refrigeration system. Since small missiles are unable to provide a self-contained closed-cycle ECS, other means of providing thermal control must be employed. Another prior art form of thermal control has been the use of fins exposed within an air stream. In the recent past, the power dissipation requirement levels of the missile-borne electronic systems have been low enough so that the mass of the missile structure has been used to absorb waste heat during the length of the missile flight. This method of thermal control is acceptable as long as the resultant device temperatures are within acceptable limits and as long as temperature gradients from device to device are not a problem.

Missile-based electronic systems currently under development are projected to have 10 to 100 times the waste heat dissipation requirements of existing systems. Because of power, weight and volume restrictions, a small missile cannot employ an ECS large enough to dissipate the magnitudes of power of the next generation of missile-based electronic systems. In addition, as the complexity and performance of electronic assemblies increases, it becomes essential that devices operate at a specified and uniform temperature to ensure calibrated performance. This is particularly true of phased array radars that contain a large number of substantially identical devices in the array that must have substantially identical performance characteristics.

With the foreseeable requirement of airborne electronic systems to reject a very high level of heat relative to present airborne electronic systems at a specified temperature which must be uniform over a large spatial distance without the benefit of ECS, it becomes apparent that conventional thermal control techniques as discussed above will not work adequately and that innovative methods not previously employed must be developed.

SUMMARY OF THE INVENTION

In accordance with the present invention, there is provided a system which will absorb a high level of waste heat (about 200 times more than prior systems of the type discussed above) very quickly, reject the waste heat to the ambient environment and provide a device operating temperature that is controllable. The cooling device can be expendable in that it may be capable of use only once and have a very short life time which can be on the order of up to a few hours and possibly only minutes.

Briefly, there is provided a boiling liquid refrigerant, preferably ammonia or methanol, which is vaporized by heat addition from the system electronics. The pressure on the boiling liquid refrigerant and the vaporized refrigerant thereover is maintained constant so that the temperature of vaporization is maintained constant. A preferred temperature, based upon system design, is selected and the system pressure is derived from the selected temperature for a specific fluid. It is understood that fluid selection will be based upon compatibility with the existing materials and mechanical design of the desired system, particularly with regard to system pressure. For example, using ammonia as the refrigerant, a desired system operating temperature of 18° F. will result in a system pressure of about 40 psia. In the case of a methanol refrigerant, a desired system operating temperature of 150° F. will result in a system pressure slightly greater than atmospheric. The boiling liquid refrigerant rapidly vaporizes and concomitantly removes from the system the very large amount of heat required for the refrigerant to pass from the liquid to the gaseous phase. The amount of heat absorbed by the refrigerant under these conditions is extremely high. In addition to the heat absorbed during the transition from a liquid to a vapor, heat is absorbed by the liquid as it heats up to the boiling temperature. The transition from liquid to vapor occurs at a constant temperature which may be controlled by controlling the pressure at which the vaporization takes place. The vaporization pressure is controlled by a back-pressure regulator and the liquid is supplied to the evaporator from a pressurized reservoir. The flow of fluid is controlled by a pressure/flow regulator. The pressure in the pressurized reservoir will be maintained at a higher level than the desired pressure within the evaporator so that fluid flow will always flow from reservoir to evaporator. The specific pressure within the evaporator is controlled within very narrow limits by the back-pressure regulator. All of the individual elements of the present invention are well known.

The present invention has the capability of providing extremely high heat dissipation rates. Presently existing thermal control techniques that have a similar potential cannot simultaneously achieve these rates of heat transfer and maintain the evaporator surface at a constant temperature so that all of the electronic components may operate at the same controlled temperature without any temperature gradients.

DESCRIPTION OF THE PREFERRED EMBODIMENT

Figure 1:
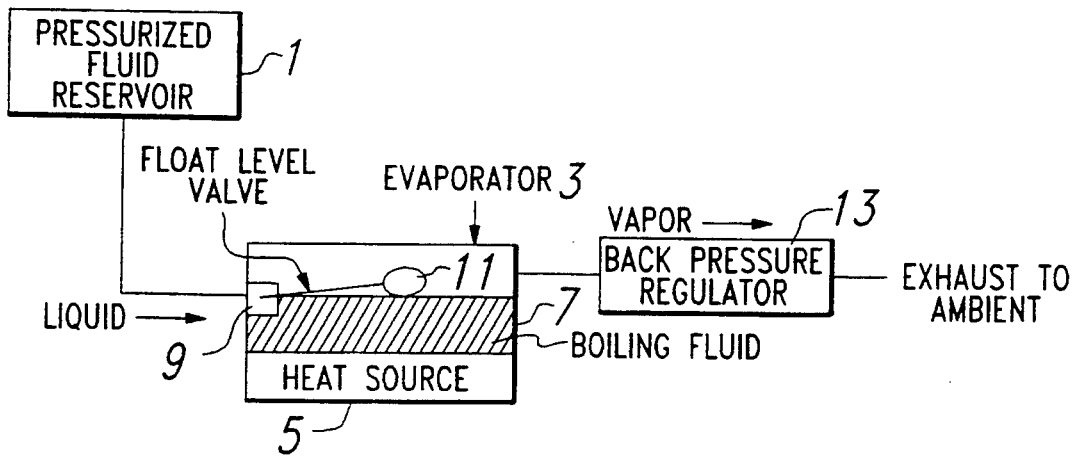
FIG. 1 is a schematic diagram of a first embodiment in accordance with the present invention.

Referring first to FIG. 1, there is shown a liquid refrigerant reservoir 1 which maintains the refrigerant therein under pressure of from about 80 to about 90 psia. The refrigerant is supplied to an evaporator 3 wherein the heat source 5 represents the heat producing electronics mounted on a cold plate with the boiling refrigerant 7 thereover and preferably in intimate contact therewith. A float level valve 9, controlled by a float 11 on the surface of the boiling refrigerant 7, opens periodically when the float 11 is lowered to open the valve and permit additional refrigerant to enter the evaporator 3 from the reservoir 1 to maintain a constant refrigerant level in the evaporator.

The boiling refrigerant 7 surrounds the cold plate portion of the heat source and absorbs the heat therefrom very rapidly. The heat from the heat source 5 causes a portion the refrigerant 7 to vaporize. The vaporized refrigerant passes to the portion of the evaporator 3 above the boiling refrigerant 7 and gradually builds up the pressure at that location. A back pressure regulator 13 controls the pressure within the evaporator 3 at which vaporization of the refrigerant 7 is taking place. Also, the temperature at which the vaporization takes place is controlled at a constant value due to the constant pressure within the evaporator 3. As the liquid refrigerant 7 is vaporized and the vapor is vented overboard by the back pressure regulator 13 and then to the external ambient, the liquid level is replenished and maintained constant in the evaporator from the pressurized reservoir 1. Since the vaporization takes place at a fixed temperature, the heat source 5 is also maintained at a substantially constant temperature.

Figure 2:
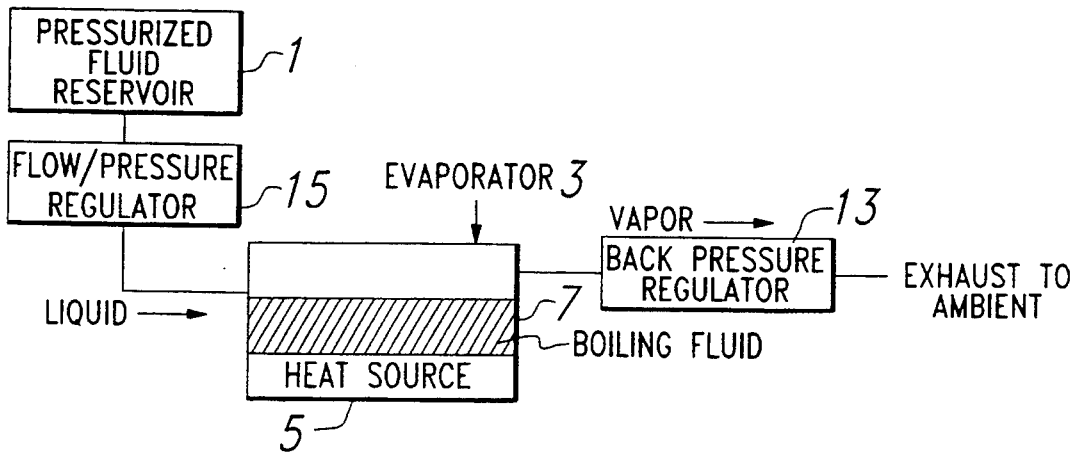
FIG. 2 is a schematic diagram of a second embodiment in accordance with the present invention.

Referring now to FIG. 2, there is shown a second embodiment of the invention wherein the float level valve 9 with float 11 of FIG. 1 is replaced by a flow/pressure regulator 15 disposed between the pressurized fluid reservoir 1 and the evaporator 3. The flow/pressure regulator 15 controls the flow of fluid into the evaporator to ensure that an adequate amount of fluid is resident in the evaporator. A typical flow pressure regulator which can be used in accordance with the present invention is an orifice which controls the flow of fluid from the pressurized reservoir 1 to the evaporator 3.

A basic feature of the present invention as shown with reference to FIGS. 1 and 2 is to have the heat-dissipating electronics in direct contact with the evaporator surface. This arrangement is very similar to the liquid-cooled cold plates used in conjunction with an airborne ECS which circulates chilled liquid. It is also possible to integrate the back-pressure regulator and the flow/pressure regulator into the coldplate and avoid having so many discrete components.

Figure 3:
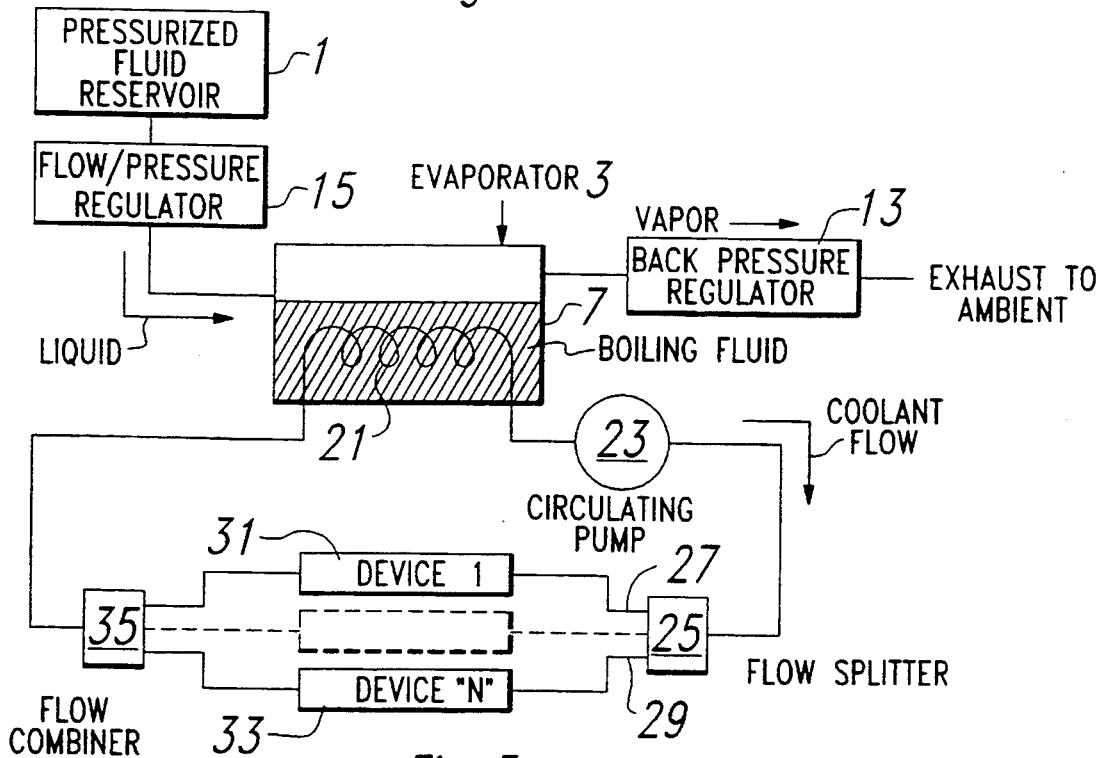
FIG. 3 is a schematic diagram of a third embodiment in accordance with the present invention.

In a related application, as shown in FIG. 3, the individual devices or heat dissipating components are cooled with a circulating liquid which is, in turn, cooled by circulation through an evaporator supplied with liquid refrigerant from the pressurized reservoir and controlled by the flow/pressure regulator. The back-pressure regulator, once again, is used to control the temperature of the vaporization process. Contrary to the systems shown in FIGS. 1 and 2, heat producing components are not directly mounted to the evaporator. In this configuration, a coolant is circulated to transport heat from heat producing assemblies to the evaporator where the heat is removed by the refrigerant inside the evaporator as it changes from a liquid to a vapor. In this invention, the evaporator provides the means to remove heat and reject it to the ambient by use of the expendable refrigerant. This invention provides heat rejection without the use of an ECU. The refrigeration effect is achieved by the liquid as it changes phase and as the resulting vapor is dumped to ambient.

An additional feature of the invention which is beneficial in the thermal control of missile system electronics is that, for airborne launched missiles, and to a somewhat lesser extent with shipboard launched missiles, the missile and the internal electronics will be soaked to a high temperature at launch. With the technique in accordance with the present invention, it is possible to begin cooling prior to launch and then continue cooling after launch when the electronics begin operating at a higher heat level. This precooling ensures that the electronics will be afforded adequate thermal control. Also, a temperature soaked system can be cooled to a more desirable operating temperature during initial use.

Referring now to FIG. 3, there is shown a further embodiment of the invention wherein plural devices are to be cooled using a single cooling system of the type set forth, for example, in FIG. 2. In the present system, everything operates as discussed above with respect to FIG. 2. However, the heat source in contact with the boiling refrigerant liquid 5 is a coolant carrying coil 21 through which cooling flows to a circulating pump 23. This cooling then flows to a flow splitter 25 which splits the coolant flow into plural paths 27 . . . 29, one path for each device or subassembly to be cooled. The coolant removes the heat from the devices 31 . . . 33 and travels to a flow combiner 35 whereat the coolant paths are combined and the combined coolant flows to the coolant carrying coil 21. The coolant within the coil 21 is cooled in the same manner discussed above with regard to the heat source 5 and the cooled coolant is again circulated in the manner above described.

It is apparent that the pressure within the evaporator 3 in all of the above embodiments can be made adjustable, either prior to operation or on-line, by adjusting the back-pressure regulator 13. This adjustment to the back-pressure regulator can be made from an external source or via a feedback loop from components within the system itself, such as, for example, one or more of the heat sources 5 or devices 31, 33.

Figure 4:
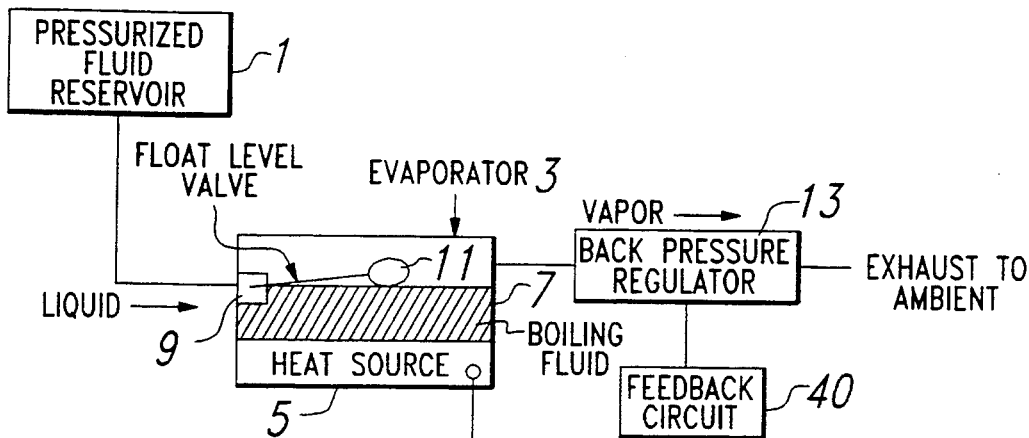
FIG. 4 is a diagram as in FIG. 1 showing temperature feedback from the heat source to the back pressure regulator.
Figure 5:
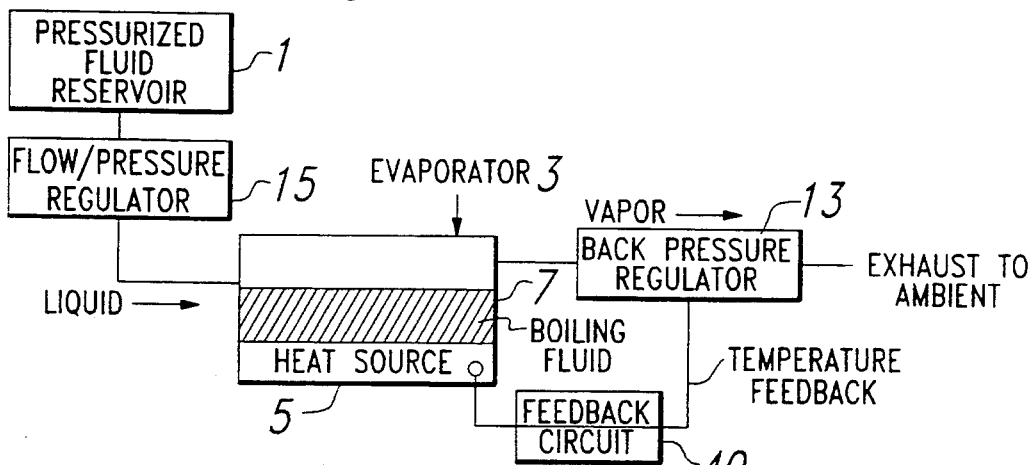
FIG. 5 is a diagram as in FIG. 2 showing temperature feedback from the heat source to the back pressure regulator.
Figure 6:
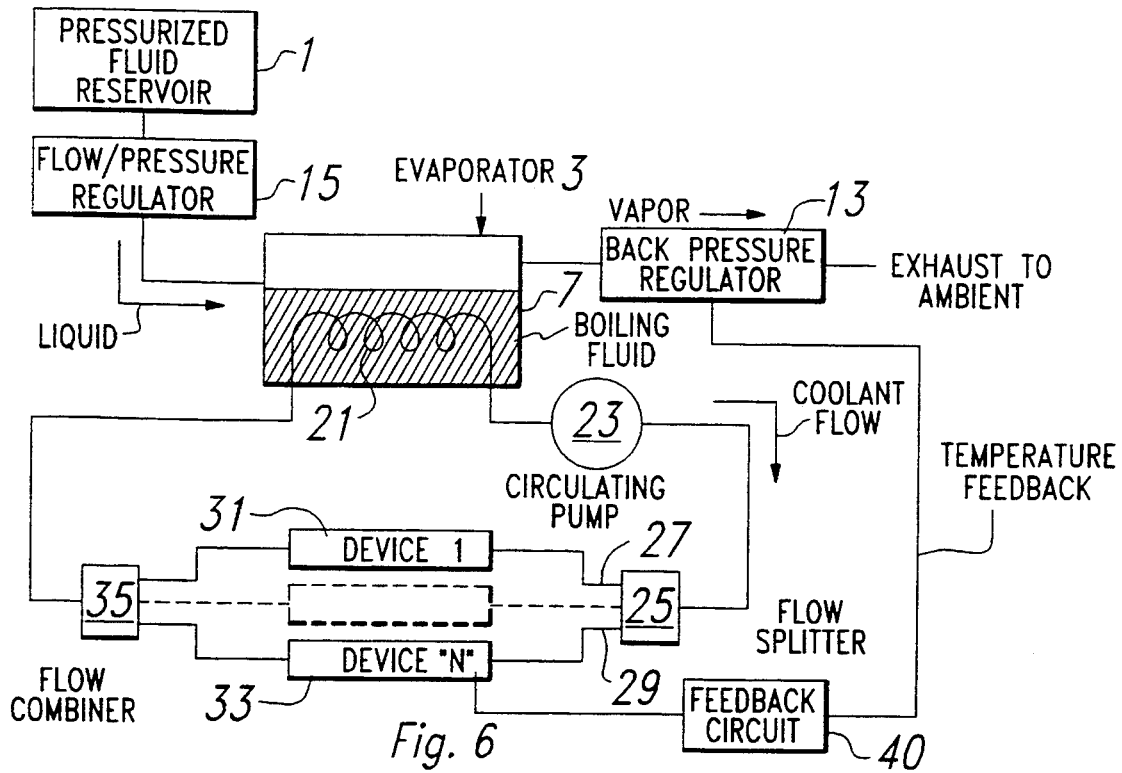
FIG. 6 is a diagram as in FIG. 3 showing temperature feedback from the heat source to the back pressure regulator.
Figure 7:
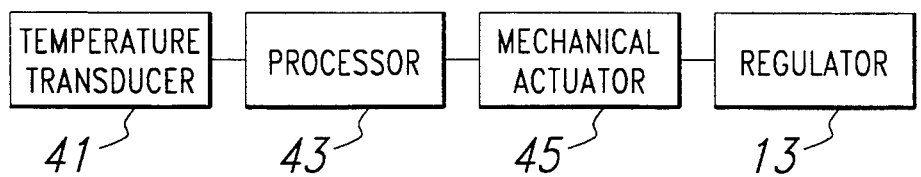
FIG. 7 is a schematic diagram of a feedback circuit of FIG. 6.

FIGS. 4 to 6 are identical to FIGS. 1 to 3 except that they additionally show a temperature feedback loop including a feedback circuit 40 from the heat source to the back pressure regulator. The design of the feedback loop and back pressure regulator adjustment under control of the feedback loop are readily apparent to those skilled in the art. A schematic diagram of a typical feedback circuit 40 is shown in FIG. 7 wherein a temperature transducer 41 is disposed at the heat source (5 in FIGS. 4 and 5 and 33 in FIG. 6) and provides an electrical output indicative of the sensed temperature. This electrical output is processed in a processor 43 and determines whether the pressure setting of the back pressure regulator 13 should be adjusted and the amount of such adjustment in standard manner. This adjustment signal controls a mechanical actuator 45 which in turn controls the regulator setting.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modification.

We claim:

1. A thermal control system which comprises:
   (a) a heat source;
   (b) an enclosed chamber having a refrigerant inlet and a refrigerant outlet;
   (c) a refrigerant disposed in said chamber, said refrigerant having a liquid phase disposed in said chamber and a gaseous phase disposed in said chamber above said liquid phase, said liquid phase contacting said heat source and removing heat from said heat source;
   (d) a source of said refrigerant constantly coupled to said refrigerant inlet and maintained at a higher pressure than the pressure of said gaseous phase in said chamber to maintain a predetermined liquid level in said chamber;
   (e) a variable back pressure regulator coupled to said refrigerant outlet to maintain the pressure of said gaseous phase in said chamber at a predetermined level; and
   (f) a controller responsive to the temperature of said heat source varying the pressure setting of said back pressure regulator on-line in response to the temperature of said heat source to control the temperature of said heat source.

2. The system of claim 1 wherein said liquid phase is maintained at the boiling temperature of said refrigerant by the pressure of said gaseous phase.

3. The system of claim 2 wherein said control path is a temperature feedback from said heat source to said back pressure regulator to provide on-line adjustment of the setting of said back pressure regulator to adjust said predetermined level of said pressure of said gaseous phase in said enclosed chamber.

4. The system of claim 1 further including an orifice coupled between said source of said refrigerant and said inlet for controlling refrigerant pressure at said inlet.

5. The system of claim 1 wherein said heat source includes a coil disposed in said liquid refrigerant, said coil carrying a coolant liquid therein and a conduit for said coolant liquid coupled to said coil extending externally of said enclosed chamber and thermally coupled to heat producing devices through which said coolant circulates.

6. The system of claim 5, wherein said conduit includes a flow splitter for splitting the flow of said coolant liquid into plural separate paths, each of said separate paths having a heat producing device therein and in the path of said coolant and a flow combiner for combining the flow of said coolant from said separate paths downstream of said heat producing device in each said path.

7. The system of claim 6 wherein said control path is a temperature feedback from said heat source to said back pressure regulator to provide on-line adjustment of the setting of said back pressure regulator to adjust said predetermined level of said pressure of said gaseous phase in said enclosed chamber.

8. The system of claim 5 wherein said control path is a temperature feedback from said heat source to said back pressure regulator to provide on-line adjustment of the setting of said back pressure regulator to adjust said predetermined level of said pressure of said gaseous phase in said enclosed chamber.

9. The system of claim 1 wherein said control path is a temperature feedback from said heat source to said back pressure regulator to provide on-line adjustment of the setting of said back pressure regulator to adjust said predetermined level of said pressure of said gaseous phase in said enclosed chamber.

10. The system of claim 1 wherein said control path is a temperature feedback from said heat source to said back pressure regulator to provide on-line adjustment of the setting of said back pressure regulator to adjust said predetermined level of said pressure of said gaseous phase in said enclosed chamber.

11. A thermal control method which comprises the steps of:
    (a) providing a heat source;
    (b) providing an enclosed chamber having a refrigerant inlet and a refrigerant outlet;
    (c) disposing a refrigerant in said chamber and in contact with said heat source, said refrigerant, when in said chamber, having a liquid phase and a gaseous phase above said liquid phase and removing heat from said heat source;
    (d) providing a source of said refrigerant coupled to said refrigerant inlet;
    (e) constantly maintaining said refrigerant at said refrigerant inlet at a higher pressure than the pressure of said gaseous phase in said chamber to maintain a predetermined liquid level in said chamber;
    (f) providing a variable back pressure regulator coupled to said refrigerant outlet to maintain the pressure of said gaseous phase in said chamber at a predetermined level; and
    (g) varying the pressure setting of said back pressure regulator on-line in response to the temperature of said heat source to control the temperature of said heat source.

12. The method of claim 11 further including the step of maintaining said liquid phase at the boiling temperature of said refrigerant by the pressure of said gaseous phase.

13. The method of claim 12 wherein said control path is a temperature feedback from said heat source to said back pressure regulator to provide on-line adjustment of the setting of said back pressure regulator to adjust said predetermined level of said pressure of said gaseous phase in said enclosed chamber.

14. The method of claim 11 further including the step of providing an orifice coupled between said source of said refrigerant and said inlet for controlling refrigerant pressure at said inlet.

15. The method of claim 14 wherein said control path is a temperature feedback from said heat source to said back pressure regulator to provide on-line adjustment of the setting of said back pressure regulator to adjust said predetermined level of said pressure of said gaseous phase in said enclosed chamber.

* * * * *